United States Patent [19]
Houghten et al.

[11] Patent Number: 5,206,547
[45] Date of Patent: Apr. 27, 1993

[54] HIGH-SPEED PROGRAMMABLE STATE COUNTER

[75] Inventors: Jonathan L. Houghten, Chandler; Jerry E. Prioste, Scottsdale, both of Ariz.

[73] Assignee: Motorola, Inc., Schaumburg, Ill.

[21] Appl. No.: 817,213

[22] Filed: Jan. 6, 1992

[51] Int. Cl.[5] .......................................... H03K 23/40
[52] U.S. Cl. ..................................... 307/465; 377/39; 307/272.2; 307/455
[58] Field of Search .................. 377/39, 52; 307/272.2, 307/465, 467, 455

[56] References Cited

U.S. PATENT DOCUMENTS

| | | | |
|---|---|---|---|
| 3,720,910 | 3/1973 | McLaughlin et al. | 377/39 |
| 4,608,706 | 8/1986 | Chang et al. | 377/39 |
| 4,628,216 | 12/1986 | Mazumder | 307/455 |
| 5,155,383 | 10/1992 | Barbera | 307/272.2 |

Primary Examiner—David R. Hudspeth
Assistant Examiner—Jon Santamauro
Attorney, Agent, or Firm—Robert D. Atkins

[57] ABSTRACT

A programmable state counter generates an output signal when a predetermined count sequence matches a programmed input data pattern. A synchronous maximal length shift counter generates $2^N-1$ unique output states as a predetermined count sequence. A string of first flipflops receive the programmed input data pattern at first data input and the predetermined count sequence at second data inputs. The first and second data inputs of first flipflops are combined as a logical exclusive-NOR operation. A second flipflop has a first data input wired-OR'ed to inverted outputs of a first portion of the first flipflops, and a second data input wired-OR'ed to the inverted outputs of a second portion of the first flipflops. The first and second data inputs of the second flipflop are combined as a logical OR operation for providing the output signal of the programmable state counter.

9 Claims, 3 Drawing Sheets

HIGH-SPEED PROGRAMMABLE STATE COUNTER

BACKGROUND OF THE INVENTION

The present invention relates in general to programmable state counters and, more particularly, to a high speed programmable state counter.

Programmable state counters are frequently used in communication networks for synchronizing and controlling data transfer. For example, the counter may keep track of the number of data bits received in a serial shift register, say one or two bits per count, and provide a "data stream received" signal flag to further processing logic upon receiving a predetermined number of data bits. The data bits can be clocked off the rising and falling edge transitions of the state counter. The programmable feature of the counter allows the user to select the number of bits to be received in the serial shift register before actuating the signal flag. Once the predetermined number of data bits are loaded into the serial shift register and the signal flag is activated, the data may be transferred to parallel latches for synchronous processing through the communication network.

Most, if not all, prior art programmable state counters include a string of flipflops connected for generating a predetermined series of states which are compared against the programmed input data pattern. When the state of shift counter matches the input data pattern, as detected by a second string of flipflops, the output of the programmable state counter generates the signal flag indicating the desired number of data bits have been received in the data shift register. A reset signal restarts the predetermined count sequence in preparation for the next cycle.

The prior art programmable state counters include combinational logic exclusive-NOR gates to perform the comparison between the programmed input data pattern and the predetermined states of the shift counter. Also in the shift counter, an exclusive-NOR gate and an OR gate is required in the feedback path. The combinational logic introduces gate delays thereby slowing the operation of the programmable state counter. Typical operating frequencies of prior art programmable state counters range from 50 MHz to 100 MHz. As the data transfer rates required for present and future communication systems continue to increase, the operating frequency of the programmable state counters must increase accordingly.

Therefore, a need exists for an improved programmable state counter having fewer gate delays in the comparison logic allowing operation at higher frequencies.

SUMMARY OF THE INVENTION

Briefly stated, the invention comprises a programmable state counter for generating an output signal when a predetermined count sequence matches a programmed input data pattern comprising first means for generating the predetermined count sequence at a plurality of outputs. A plurality of first flipflops each include first and second data inputs, an output and an inverted output wherein the first data inputs receive the programmed input data pattern and the second data inputs are respectively coupled to the plurality of outputs of the first means. The first and second data inputs of each of the plurality of first flipflops are combined as a logical exclusive-NOR operation for providing an output signal at the output of each of the plurality of first flipflops. A second flipflop includes a first data input wired-OR'ed to the inverted outputs of a first portion of the plurality of first flipflops, and a second data input wired-OR'ed to the inverted outputs of a second portion of the plurality of first flipflops. The first and second data inputs of the second flipflop are combined as a logical OR operation for providing the output signal of the programmable state counter.

DETAILED DESCRIPTION OF THE PREFERRED EMBODIMENT

Figure 1:
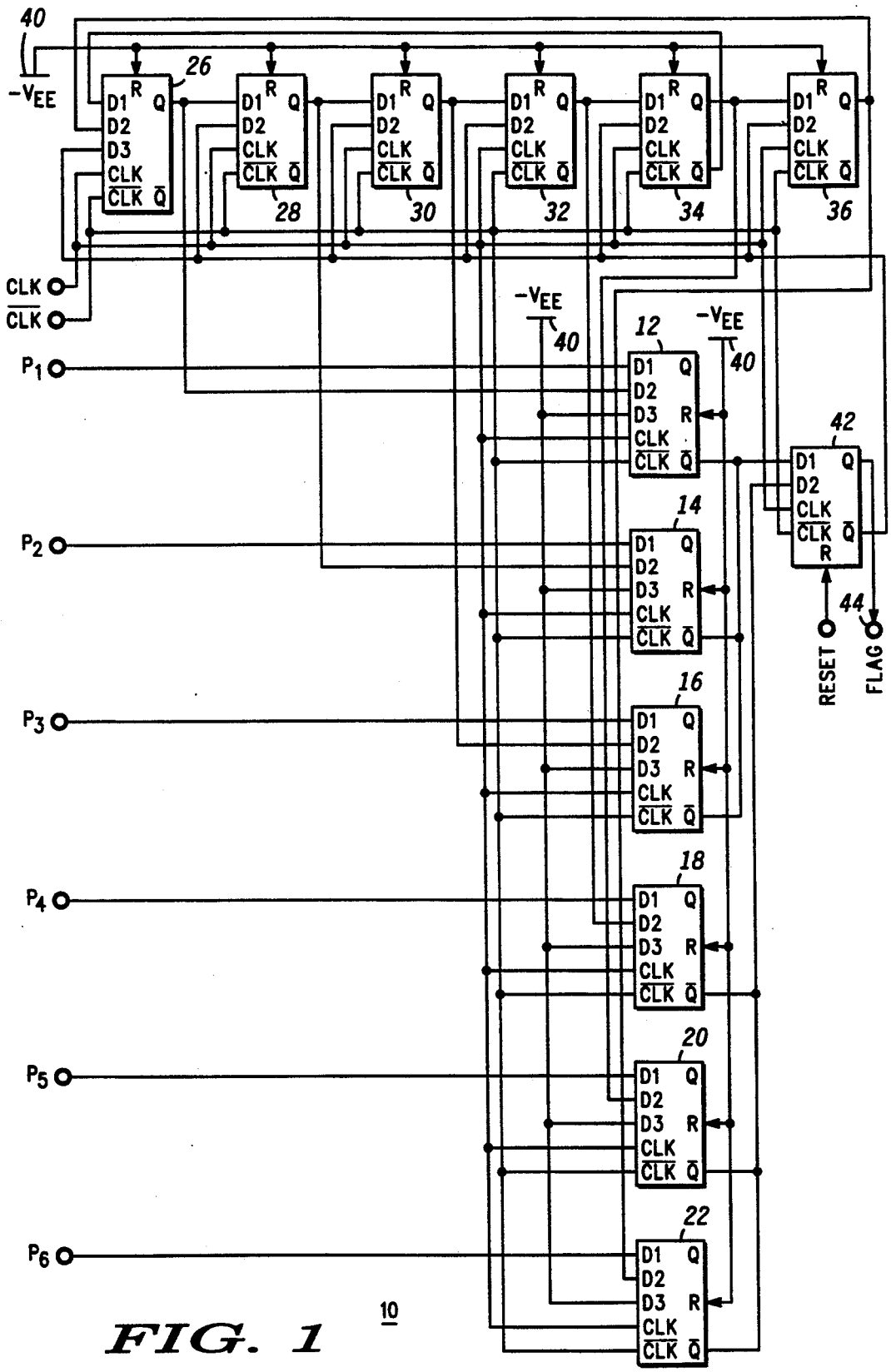
FIG. 1 is a block diagram illustrating a programmable state counter.

Referring to FIG. 1, programmable state counter 10 is shown suitable for manufacturing as an integrated circuit using conventional integrated circuit processes. Programmable counter 10 receives a programmed input data pattern $P_1$, $P_2$, $P_3$, $P_4$, $P_5$, and $P_6$ for application to the $D_1$ inputs of flipflops 12, 14, 16, 18, 20 and 22, respectively. The $D_2$ inputs of flipflops 12-22 receive the count state from the Q-outputs of flipflops 26, 28, 30, 32, 34, and 36 as shown. Flipflops 26-36 collectively form a synchronous maximal length shift counter. The $D_3$ inputs of flipflops 12-22 receive a logic zero via power supply conductor 40 typically operating at a negative potential such as $-V_{EE}$. Differential CLOCK and $\overline{\text{CLOCK}}$ signals are applied at the CLK and $\overline{\text{CLK}}$ inputs of flipflops 12-36 and 42. The Q-output of flipflop 26 is coupled to the $D_1$ input of flipflop 28, and the Q-output of flipflop 28 is coupled to the $D_1$ input of flipflop 30, while the Q-output of flipflop 30 is coupled to the $D_1$ input of flipflop 32. Furthermore, the Q-output of flipflop 32 is coupled to the $D_1$ input of flipflop 34, and the Q-output of flipflop 34 is coupled to the $D_1$ input of flipflop 36, while the $\overline{Q}$-output of flipflop 34 is coupled to the $D_1$ input of flipflop 26. The Q-output of flipflop 36 is coupled to the $D_2$ input of flipflop 26. The $\overline{Q}$-outputs of flipflops 12-16 are coupled together as wired-OR logic to the $D_1$ input of flipflop 42, and the $\overline{Q}$-outputs of flipflops 18-22 are coupled together as wired-OR logic to the $D_2$ input of flipflop 42. The Q-output of flipflop 42 provides the FLAG output signal of programmable counter 10, and the $\overline{Q}$-output of flipflop 42 is coupled to the $D_3$ input of flipflop 26 and the $D_2$ inputs of flipflops 28-36. Flipflop 42 also receives a RESET signal at its R (reset) input. The R inputs of flipflops 12-36 are coupled to power supply conductor 40 for receiving a logic zero.

Flipflops 12-26 are master-slave flipflops which perform a predetermined logical operation on the signals applied at the $D_1$, $D_2$ and $D_3$ inputs with the resulting signal latched at the Q-output upon receiving CLOCK and $\overline{\text{CLOCK}}$ signals. Flipflops 12-22 operate as a state detector. Further detail of flipflop 26 is provided by FIG. 2 and the associated text. Flipflops 12-22 follow a similar construction. Briefly, the $D_1$ and $D_2$ are exclusive-NOR'ed together and the result is OR'ed with the $D_3$ input as summarized in following truth table:

TABLE 1

| D1 | D2 | D3 | O |
|----|----|----|---|
| 0  | 0  | 0  | 1 |
| 0  | 1  | 0  | 0 |
| 1  | 0  | 0  | 0 |
| 1  | 1  | 0  | 1 |
| 0  | 0  | 1  | 1 |
| 1  | 0  | 1  | 1 |
| 0  | 1  | 1  | 1 |
| 1  | 1  | 1  | 1 |

Master-slave flipflops 28–36 and 42 also perform a logical operation on the signals applied at the $D_1$ and $D_2$ inputs thereof with the resulting signal latched at the Q-output upon receiving CLOCK and $\overline{\text{CLOCK}}$ signals. Further detail of flipflop 42 is given in FIG. 3 and the associated text. Flipflops 28–36 follow a similar construction. Briefly, the $D_1$ and $D_2$ inputs are OR'ed together as summarized in the following truth table:

| D1 | D2 | O |
|----|----|---|
| 0  | 0  | 0 |
| 0  | 1  | 1 |
| 1  | 0  | 1 |
| 1  | 1  | 1 |

The operation of programmable state counter 10 proceeds as follows. First consider the operation of flipflops 26–36 operating as a synchronous maximal length shift counter generating $2^N-1$ unique output states where N is the number of flipflops.

| State  | Count |
|--------|-------|
| 111111 | 3     |
| 011111 | 4     |
| 001111 | 5     |
| 000111 | 6     |
| 000011 | 7     |
| 000001 | 8     |
| 100000 | 9     |
| 010000 | 10    |
| 001000 | 11    |
| 000100 | 12    |
| 000010 | 13    |
| 100001 | 14    |
| 110000 | 15    |
| 011000 | 16    |
| 001100 | 17    |
| 000110 | 18    |
| 100011 | 19    |
| 010001 | 20    |
| 101000 | 21    |
| 010100 | 22    |
| 001010 | 23    |
| 100101 | 24    |
| 110010 | 25    |
| 111001 | 26    |
| 111100 | 27    |
| 011110 | 28    |
| 101111 | 29    |
| 010111 | 30    |
| 001011 | 31    |
| 000101 | 32    |
| 100010 | 33    |
| 110001 | 34    |
| 111000 | 35    |
| 011100 | 36    |
| 001110 | 37    |
| 100111 | 38    |
| 010011 | 39    |
| 001001 | 40    |
| 100100 | 41    |
| 010010 | 42    |
| 101001 | 43    |
| 110100 | 44    |
| 011010 | 45    |
| 101101 | 46    |
| 110110 | 47    |
| 111011 | 48    |
| 011101 | 49    |
| 101110 | 50    |
| 110111 | 51    |
| 011011 | 52    |
| 001101 | 53    |
| 100110 | 54    |
| 110011 | 55    |
| 011001 | 56    |
| 101100 | 57    |
| 010110 | 58    |
| 101011 | 59    |
| 010101 | 60    |
| 101010 | 61    |
| 110101 | 62    |
| 111010 | 63    |
| 111101 | 64    |
| 111110 | 65    |

To program counter 10, the user first determines the desired number of counts for the application. For example, assume the user needs five counts to clock in five data bits into a serial shift register (not shown). Reading across Table 3, a count of five corresponds to the state sequence "001111" which is applied as the program input data pattern $P_1$-$P_6$ at the $D_1$ inputs of flipflops 12–22. In order to initialize programmable state counter 10, an asynchronous RESET signal is applied to the R input of flipflop 42 to generate a logic zero at its Q-output. The RESET signal is only activated when power is first applied to the circuit. The logic zero FLAG signal at the Q-output of flipflop 42 indicates that a new cycle is starting. A logic one (from the $\overline{\text{Q}}$-output of flipflop 42) at the $D_3$ input of flipflop 26 and the $D_2$ inputs of flipflops 28–36 produces a initial count of "111111" at the Q-outputs of flipflops 26–36 on the first clock cycle. The count "111111" is applied to the $D_2$ inputs of flipflops 12–22 while the program input data pattern "001111" is applied to the $D_1$ inputs of the same.

According to the logical operation of flipflops 12–26 as given in Table 1, the $\overline{\text{Q}}$-outputs of flipflops 12–14 switch to logic one, while the $\overline{\text{Q}}$-outputs of flipflops 16–22 remain logic zero. The wired-OR logic of flipflops 12–16 produce logic one on the $D_1$ input of flipflop 42 while the wired-OR logic of flipflops 18–22 produce a logic zero on the $D_2$ input of flipflop 42. The FLAG signal at the Q-output of flipflop 42 switches to a logic one indicating the desired count sequence has not yet been reached. The second clock cycle of the differential clock signals CLOCK and $\overline{\text{CLOCK}}$ generates the next count sequence from flipflops 26–36 as "011111", as per Table 3. Again, the count sequence does not match the program input data pattern $P_1$-$P_6$, and the $\overline{\text{Q}}$-output of flipflops 12 and 16–22 are logic zero, and the Q-output of flipflop 14 remains logic one as does the Q-output of flipflop 42. The third clock cycle generates the pattern "001111" at the Q-outputs of flipflops 26–36 thereby matching the programmed input data pattern and, thus, on the fourth clock cycle switches the $\overline{\text{Q}}$-outputs of flipflops 12–22 to logic zero. Upon the fifth clock cycle, the logic zero at the $\overline{\text{Q}}$-output of flipflops 12–22 propagates through flipflop 42 and produce logic zero at the Q-output of flipflop 42 indicating a count of five has been achieved. That is, the Q-output of flipflop 42 changes state five clock cycles after the RESET signal initiated the count sequence. Although the programmed count state "001111" is only two positions away from the initial count sequence of "111111" as shown in Table 3, two additional clock cycles are required to propagate the detection through flipflops 12-22 and through flipflop 42. Thus, the minimum count sequence is three.

Alternately, if the user wanted a programmed count of 65, a program pattern of "111110" is applied as programmed input data pattern $P_1$-$P_6$ to $D_1$ inputs of flipflops 12-22, as per Table 3. After sixty-three clock cycles, the synchronous maximal length shift counter 26-36 reaches an output state of "111110" thereby matching the programmed pattern sequence. The $\bar{Q}$-outputs of flipflops 12-22 change state to logic zero on the 64th clock cycle and the Q-output of flipflop 42 changes state to logic zero on the 65th clock cycle to signify the completion of the program count sequence.

A key feature of the present invention is the incorporation of state detector logical operations, i.e., exclusive-NOR and OR functions, into flipflops 12-28 thereby eliminating gate delays associated with separate logic gates performing the same function. The prior art programmable state counter required separate exclusive-NOR gates to perform the comparison between the programmed input data pattern and the output of the shift counter. By eliminating the separate exclusive-NOR gates and OR gates and including a similar function in the flipflops, the maximum operating frequency of programmable state counter 10 approximates the delay through a single flipflop.

Figure 2:
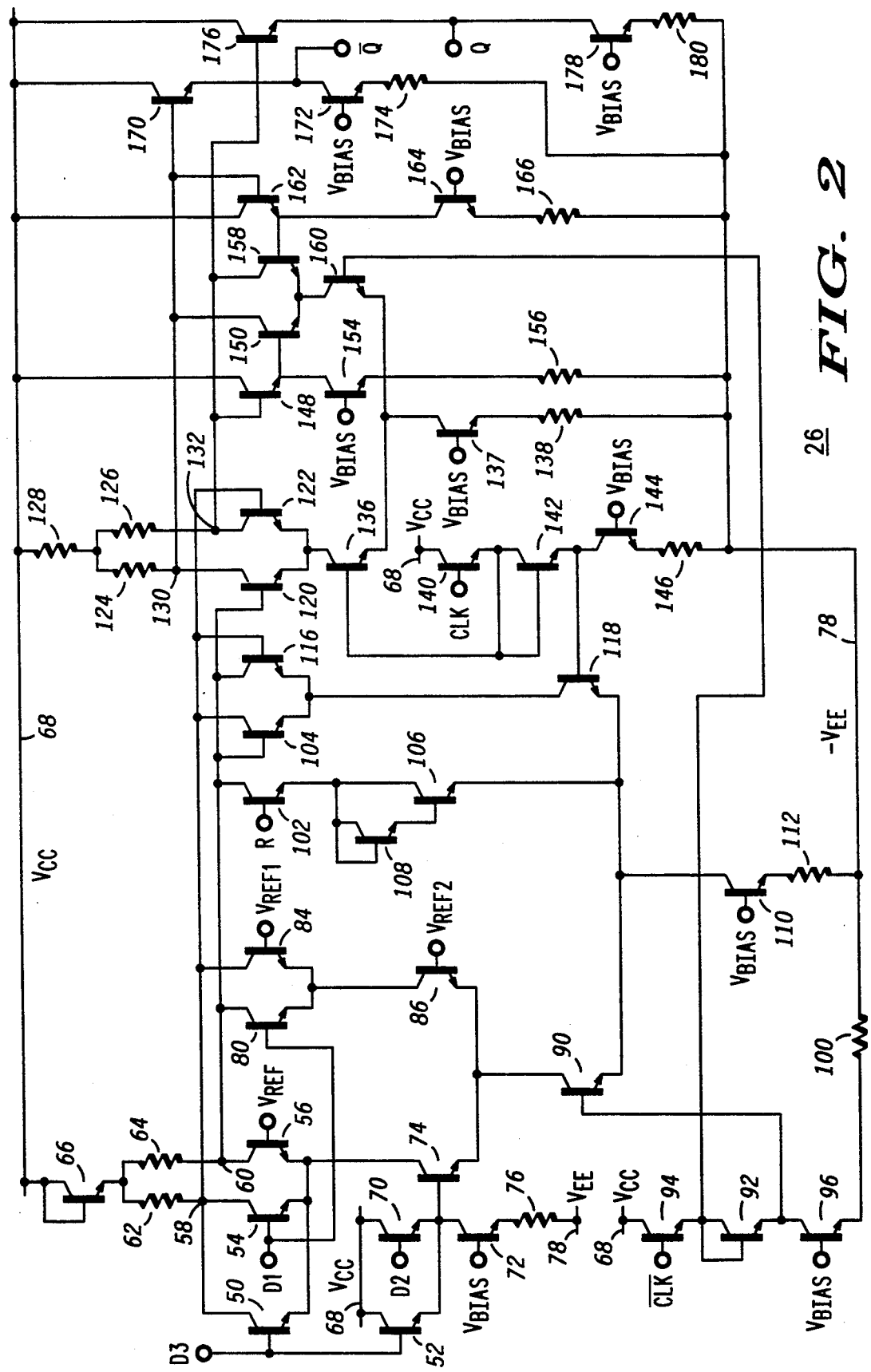
FIG. 2 is a schematic diagram illustrating a first flipflop circuit of FIG. 1.

To see how the state detector function is incorporated into flipflops 12-22, examine the further detail of flipflop 26 as shown in FIG. 2. Power supply conductor 68 operates at a positive potential ($V_{CC}$) such as 0.0 volts, while power supply conductor 78 operates at a negative potential ($-V_{EE}$) such as $-5.2$. The bias potential $V_{BIAS}$ applied at the bases of transistors 72, 96, 110, 137, 144, 154, 164, 172 and 178 is set to $-3.9$ volts. The reference potential $V_{REF1}$ is $-1.3$ volts, and the reference potential $V_{REF2}$ is $-2.0$ volts (one diode drop lower than $V_{REF1}$).

Flipflop 26 is a master-slave type flipflop controlled by the clock signals CLOCK and $\overline{\text{CLOCK}}$. If the $D_3$ input is logic one then the Q-output of flipflop 26 is always logic one after an active clock transition. A logic one $D_3$ input signal turns on transistors 50 and 52 and pulls node 58 to logic zero during the master portion of the cycle when $\overline{\text{CLOCK}}$ is logic one. Node 60 is logic one due the differential nature of transistors 54-56. When the CLOCK signal becomes logic one, flipflop 26 switches to the slave portion of the cycle, turning on transistors 140, 142 and 118 and locking the logic levels on nodes 58 and 60. For example, the logic zero at node 58 turns off transistor 116 while the logic one at node 60 turns on transistor 104 to lock the logic zero at node 58. The logic one at node 60 enables transistor 120 and the logic zero at node 58 disables transistor 122. Node 132 is pulled to logic one by resistors 126 and 128 thereby turning on transistor 176 and producing a logic one at the Q-output of flipflop 26, as per Table 1. Node 130 is logic zero and transistor 170 is off allowing transistor 172 to pull the $\bar{Q}$-output of flipflop 26 to logic zero.

Since flipflops 12-22 are operating as a state detector, the $D_3$ inputs of flipflops 12-22 are hard-wired to logic zero ($-V_{EE}$) at power supply conductor 40. However, the $D_3$ input is needed in flipflop 26. The $D_3$ input could be left floating to obtain a logic zero. First consider the case where $D_1$ and $D_2$ inputs are logic zero. Transistors 54, 70 and 74 are non-conductive. Hence, differential transistor pair 80-84 are controlling nodes 58-60 instead of transistors 54-56. The logic zero at the base of transistor 80 allows node 60 to become logic one while transistor 84 pulls node 58 to logic zero during the master portion of the cycle with $\overline{\text{CLOCK}}$ at logic one. When flipflop 26 switches to the slave portion of the cycle, the logic zero and logic one at nodes 58-60 are locked in place by transistors 104 and 116 as previously described. Transistor 120 conducts and turns off transistor 170 producing a logic zero at the $\bar{Q}$-output of flipflop 26. Transistor 122 remains non-conductive allowing transistor 176 to produce a logic one at the Q-output of flipflop 26, as per Table 1.

When the $D_1$ and $D_2$ inputs are logic one, transistors 54, 70 and 74 are enabled and nodes 58-60 become logic zero and logic one, respectively, during the master portion of the cycle. Differential transistors 54-56 are controlling nodes 58-60 with transistors 70-74 conducting. Again, during the slave portion of the cycle, the logic zero and logic one at nodes 58-60 turn on transistor 120 and turn off transistor 122 producing a logic one at the Q-output of flipflop 26, see Table 1.

Next consider the case where the $D_1$ input is logic one and the $D_2$ input is logic zero. Transistors 70 and 74 are non-conductive leaving differential transistor pair 80-84 controlling nodes 58-60. The logic one at the base of transistor 80 forces node 60 to logic zero while transistor 84 turns off releasing node 58 to logic one via resistor 62 during the master portion of the cycle. When flipflop 26 switches to the slave portion of the cycle, the logic one and logic zero at nodes 58-60 are locked in place by transistors 104 and 116. Transistor 122 conducts resulting in transistor 176 turning off and producing a logic zero at the Q-output of flipflop 26, as per Table 1. Transistor 120 remains non-conductive allowing transistor 170 to turn on from the logic one at node 130. The $\bar{Q}$-output of flipflop 26 switches to logic one.

When the $D_1$ input is logic zero and the $D_2$ input is logic one, transistors 70 and 74 are turned on enabling the conduction path through differential transistor pair 54-56. Nodes 58-60 become logic one and logic zero, respectively, due to the logic zero at the base of transistor 54. During the slave portion of the cycle, the logic one and logic zero at nodes 58-60 turn off transistor 120 and turn on transistor 122 producing a logic zero at the Q-output of flipflop 26, see Table 1.

After power initialization, the RESET signal remains at logic zero. The programmable count $P_1$-$P_6$ in conjunction with flipflops 26-36 provides an automatic initialization for future counting sequences. With the R input at logic zero, transistor 102 turns off and releases node 60 for normal operation.

Figure 3:
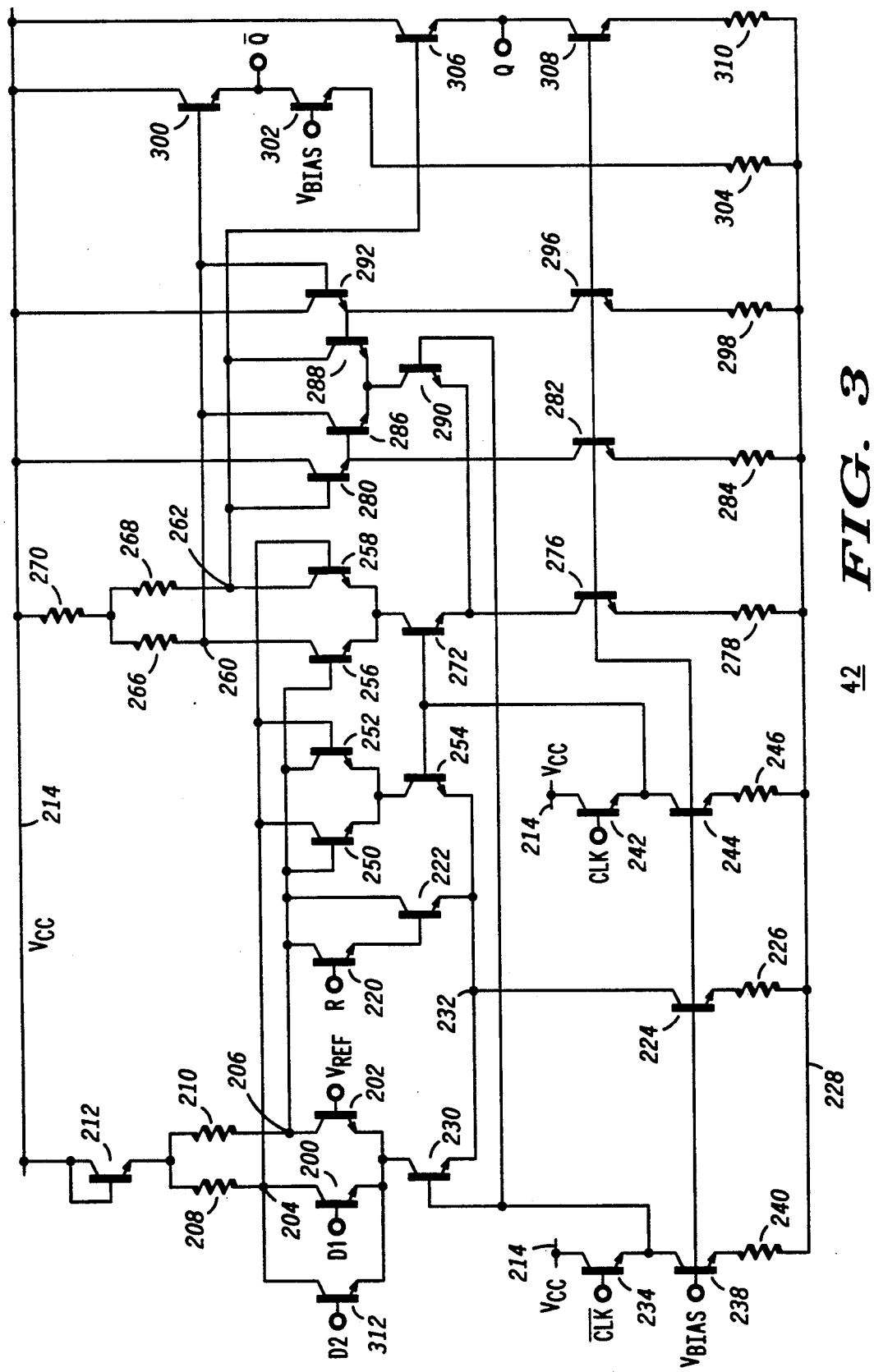
FIG. 3 is a schematic diagram illustrating a second flipflop circuit of FIG. 1.

Further detail of flipflop 42 is shown in FIG. 3. Power supply conductor 214 operates at a positive potential ($V_{CC}$) such as 0.0 volts, while power supply conductor 228 operates at a negative potential ($-V_{EE}$) such as $-5.2$. The bias potential $V_{BIAS}$ applied at the bases of transistors 224, 238, 244, 276, 282, 296, 302 and 308 is set to $-3.9$ volts. The reference potential $V_{REF}$ is $-1.3$ volts.

Flipflop 42 is a master-slave type flipflop controlled by the clock signals CLOCK and $\overline{\text{CLOCK}}$. First consider the case where $D_1$ and $D_2$ inputs are logic zero. Transistors 200 and 312 are turned off releasing node 204, and transistor 202 is turned on pulling node 206 to logic zero during the master portion of the cycle with $\overline{\text{CLOCK}}$ at logic one. When the CLOCK signal becomes logic one switching flipflop 42 to the slave portion of the cycle, the logic one and logic zero at nodes 204–206 are locked in place by transistors 250 and 252. For example, the logic zero at node 206 turns off transistor 250 while the logic one at node 204 turns on transistor 252 to lock the logic zero at node 206. The logic one at node 204 enables transistor 258 and the logic zero at node 206 disables transistor 256. Node 260 is pulled to logic one by resistors 266 and 270 thereby turning on transistor 300 and producing a logic one at the $\overline{Q}$-output of flipflop 28. Node 262 is logic zero and transistor 306 is off allowing the Q-output of flipflop 42 to be pulled to a logic zero by transistor 308. Hence, the Q-output of flipflop is logic zero with the $D_1$ and $D_2$ inputs at logic zero in accordance with Table 2.

When either (or both) the $D_1$ and $D_2$ inputs are logic one, transistor 200 or transistor 312 conducts and nodes 204–206 become logic zero and logic one, respectively, by nature of the differential operation of transistor 200–202 during the master portion of the cycle with $\overline{\text{CLOCK}}$ at logic one. When the CLOCK signal switches flipflop 42 to the slave portion of the cycle, the logic zero and logic one at nodes 204–206 are locked in place by transistors 250–252. Transistor 256 conducts and produces a logic zero at node 260 resulting in transistor 300 producing a logic zero at the $\overline{Q}$-output of flipflop 28. Transistor 258 remains non-conductive allowing transistor 306 to turn on and produce a logic one from the logic one at node 262. The Q-output of flipflop 42 switches to logic one, see Table 2.

A logic one RESET signal applied at the R input enables transistor 220 and pulls node 206 to logic zero, leaving node 204 at logic one. The logic one and logic zero at nodes 204–206, respectively, produce a logic zero at the Q-output of flipflop during the slave portion of the cycle. The RESET signal is set to logic zero turning off transistor 220 and releasing node 206 for normal operation.

Hence, what has been provided is a novel programmable state counter having increased operating speed by integrating state detector exclusive-NOR and OR logical operations into the master section of the flipflops. The programmable state counter approaches an operating frequency commensurate with the delay through a single flipflop. While specific embodiments of the present invention have been shown and described, further modifications and improvements will occur to those skilled in the art. It is understood that the invention is not limited to the particular forms shown and it is intended for the appended claims to cover all modifications which do not depart from the spirit and scope of this invention.

What is claimed is:

1. A programmable state counter for generating an output signal when a predetermined count sequence matches a programmed input data pattern, comprising:

first means for generating the predetermined count sequence at a plurality of outputs;

a plurality of first flipflops each having first and second data inputs, an output and an inverted output, said first data inputs receiving the programmed input data pattern, said second data inputs being respectively coupled to said plurality of outputs of said first means, said first and second data inputs of each of said plurality of first flipflops combining as a logical exclusive-NOR operation for providing an output signal at said output of each of said plurality of first flipflops; and a second flipflop having first and second data inputs and an output, said first data input being wired-OR'ed to said inverted outputs of a first portion of said plurality of first flipflops, said second data input being wired-OR'ed to said inverted outputs of a second portion of said plurality of first flipflops, said first and second data inputs of said second flipflop combining as a logical OR operation for providing the output signal of the programmable state counter.

2. The programmable state counter of claim 1 wherein said plurality of first flipflops each include a third data input coupled to a first power supply conductor, said third data input of each of said plurality of first flipflops combining as a logical OR with said exclusive-NOR operation on said first and second data inputs for providing said output signal of each of said plurality of first flipflops.

3. The programmable state counter of claim 2 wherein said second flipflop includes an inverted output and a reset input coupled for receiving a reset signal.

4. The programmable state counter of claim 3 wherein said first means includes:

a third flipflop having first, second and third data inputs and an output, said first and second data inputs combining as a logical exclusive-NOR operation which is then OR'ed with said third data input for providing a first bit of the predetermined count sequence at an output, said third data input being coupled to said inverted output of said second flipflop;

a fourth flipflop having first and second data inputs and an output, said first and second data inputs combining as a logical OR operation for providing a second bit of the predetermined count sequence at an output, said first data input being coupled to said output of said third flipflop, said second data input being coupled to said inverted output of said second flipflop;

a fifth flipflop having first and second data inputs and an output, said first and second data inputs combining as a logical OR operation for providing a third bit of the predetermined count sequence at an output, said first data input being coupled to said output of said fourth flipflop, said second data input being coupled to said inverted output of said second flipflop;

a sixth flipflop having first and second data inputs and an output, said first and second data inputs combining as a logical OR operation for providing a fourth bit of the predetermined count sequence at an output, said first data input being coupled to said output of said fifth flipflop, said second data input being coupled to said inverted output of said second flipflop;

a seventh flipflop having first and second data inputs and an output and an inverted output, said first and second data inputs combining as a logical OR operation for providing a fifth bit of the predetermined count sequence at an output, said first data input being coupled to said output of said sixth flipflop, said second data input being coupled to said inverted output of said second flipflop, said inverted output being coupled to said first data input of said third flipflop; and an eighth flipflop having first and second data inputs and an output, said first and second data inputs combining as a logical OR operation for providing a sixth bit of the predetermined count sequence at an output, said first data input being coupled to said output of said seventh flipflop, said second data input being coupled to said inverted output of said second flipflop, said output being coupled to said second data input of said third flipflop.

5. A method of generating an output signal when a predetermined count sequence matches a programmed input data pattern applied to a programmable state counter, comprising the steps of:

generating the predetermined count sequence;

combining first and second data inputs of each of a plurality of first flipflops as a logical exclusive-NOR operation for providing an output signal and an inverted output signal, said first data inputs receiving the programmed input data pattern, said second data inputs receiving the predetermined count sequence;

applying said inverted outputs of a first portion of said plurality of first flipflops to a first data input of a second flipflop in a wired-OR configuration;

applying said inverted outputs of a second portion of said plurality of first flipflops to a second data input of said second flipflop in a wired-OR configuration; and combining said first and second data inputs of said second flipflop as a logical OR operation for providing the output signal of the programmable state counter.

6. An integrated programmable state counter for generating an output signal when a predetermined count sequence matches a programmed input data pattern, comprising:

first means for generating the predetermined count sequence at a plurality of outputs;

a plurality of first flipflops each having first and second data inputs, an output and an inverted output, said first data inputs receiving the programmed input data pattern, said second data inputs being respectively coupled to said plurality of outputs of said first means, said first and second data inputs of each of said plurality of first flipflops combining as a logical exclusive-NOR operation for providing an output signal at said output of each of said plurality of first flipflops; and a second flipflop having first and second data inputs and an output, said first data input being wired-OR'ed to said inverted outputs of a first portion of said plurality of first flipflops, said second data input being wired-OR'ed to said inverted outputs of a second portion of said plurality of first flipflops, said first and second data inputs of said second flipflop combining as a logical OR operation for providing the output signal of the programmable state counter.

7. The programmable state counter of claim 6 wherein said plurality of first flipflops each include a third data input coupled to a first power supply conductor, said third data input of each of said plurality of first flipflops combining as a logical OR with said exclusive-NOR operation on said first and second data inputs for providing said output signal of each of said plurality of first flipflops.

8. The programmable state counter of claim 7 wherein said second flipflop includes an inverted output and a reset input coupled for receiving a reset signal.

9. The programmable state counter of claim 8 wherein said first means includes:

a third flipflop having first, second and third data inputs and an output, said first and second data inputs combining as a logical exclusive-NOR operation which is then OR'ed with said third data input for providing a first bit of the predetermined count sequence at an output, said third data input being coupled to said inverted output of said second flipflop;

a fourth flipflop having first and second data inputs and an output, said first and second data inputs combining as a logical OR operation for providing a second bit of the predetermined count sequence at an output, said first data input being coupled to said output of said third flipflop, said second data input being coupled to said inverted output of said second flipflop;

a fifth flipflop having first and second data inputs and an output, said first and second data inputs combining as a logical OR operation for providing a third bit of the predetermined count sequence at an output, said first data input being coupled to said output of said fourth flipflop, said second data input being coupled to said inverted output of said second flipflop;

a sixth flipflop having first and second data inputs and an output, said first and second data inputs combining as a logical OR operation for providing a fourth bit of the predetermined count sequence at an output, said first data input being coupled to said output of said fifth flipflop, said second data input being coupled to said inverted output of said second flipflop;

a seventh flipflop having first and second data inputs and an output and an inverted output, said first and second data inputs combining as a logical OR operation for providing a fifth bit of the predetermined count sequence at an output, said first data input being coupled to said output of said sixth flipflop, said second data input being coupled to said inverted output of said second flipflop, said inverted output being coupled to said first data input of said third flipflop; and an eighth flipflop having first and second data inputs and an output, said first and second data inputs combining as a logical OR operation for providing a sixth bit of the predetermined count sequence at an output, said first data input being coupled to said output of said seventh flipflop, said second data input being coupled to said inverted output of said second flipflop, said output being coupled to said second data input of said third flipflop.

* * * * *